United States Patent
Burns

(10) Patent No.: US 7,812,606 B2
(45) Date of Patent: Oct. 12, 2010

(54) DEMOUNTABLE CRYOGENIC NMR CONNECTION ASSEMBLY SYSTEMS AND METHODS

(75) Inventor: Sean T. Burns, East Palo Alto, CA (US)

(73) Assignee: Varian, Inc., Santa Clara, CA (US)

( * ) Notice: Subject to any disclaimer, the term of this patent is extended or adjusted under 35 U.S.C. 154(b) by 200 days.

(21) Appl. No.: 12/242,623

(22) Filed: Sep. 30, 2008

(65) Prior Publication Data

US 2010/0079143 A1    Apr. 1, 2010

(51) Int. Cl.
*G01V 3/00*    (2006.01)
(52) U.S. Cl. .................. 324/318; 324/322
(58) Field of Classification Search ............. 324/318, 324/322
See application file for complete search history.

(56) References Cited

U.S. PATENT DOCUMENTS

| | | | |
|---|---|---|---|
| 4,578,956 A | | 4/1986 | Young |
| 5,247,256 A | * | 9/1993 | Marek .................. 324/321 |
| 5,508,613 A | * | 4/1996 | Kotsubo et al. ............ 324/318 |
| 5,682,751 A | | 11/1997 | Langhorn et al. |
| 5,921,561 A | | 7/1999 | Cedarberg |
| 7,288,939 B1 | | 10/2007 | Barbara et al. |
| 7,378,847 B2 | | 5/2008 | Barbara et al. |
| 7,408,353 B2 | * | 8/2008 | Marek et al. .................. 324/318 |
| 7,436,182 B1 | * | 10/2008 | Hudson et al. .............. 324/322 |
| 7,474,099 B2 | * | 1/2009 | Boesel et al. ................ 324/318 |
| 7,501,822 B2 | * | 3/2009 | Sacher et al. ............... 324/318 |
| 2004/0012217 A1 | | 1/2004 | Shafer et al. |

OTHER PUBLICATIONS

Daniel P. Soroka, "Workholding Collets and Factors that Affect Grip Force", Article from: Production Machining, Hardinge Workholding Division, Aug. 24, 2004, 4pgs.

\* cited by examiner

*Primary Examiner*—Louis M Arana
(74) *Attorney, Agent, or Firm*—Bella Fishman

(57) ABSTRACT

In some embodiments, a NMR spectrometer includes a NMR probe circuit component (e.g. RF coil insert, capacitor, inductor) in thermal and electrical contact with a cryogenically-cooled NMR probe support through a collet assembly. The collet assembly includes a collet assembly body connected to the probe support, a collet inserted into the collet assembly body, a pin connected to the probe circuit component, and a nut threaded over a back of the collet to secure the pin to the collet. The collet assembly body is connected to the probe circuit component and the pin is connected to the probe support. A heat exchanger may be in thermal contact with the probe support. The collet assembly provides a demountable, compact, reliable, low-resistance, and strong thermal and electrical connection particularly suited for use in NMR probes, which are commonly subject to stringent spatial and other NMR-compatibility design constraints.

20 Claims, 4 Drawing Sheets

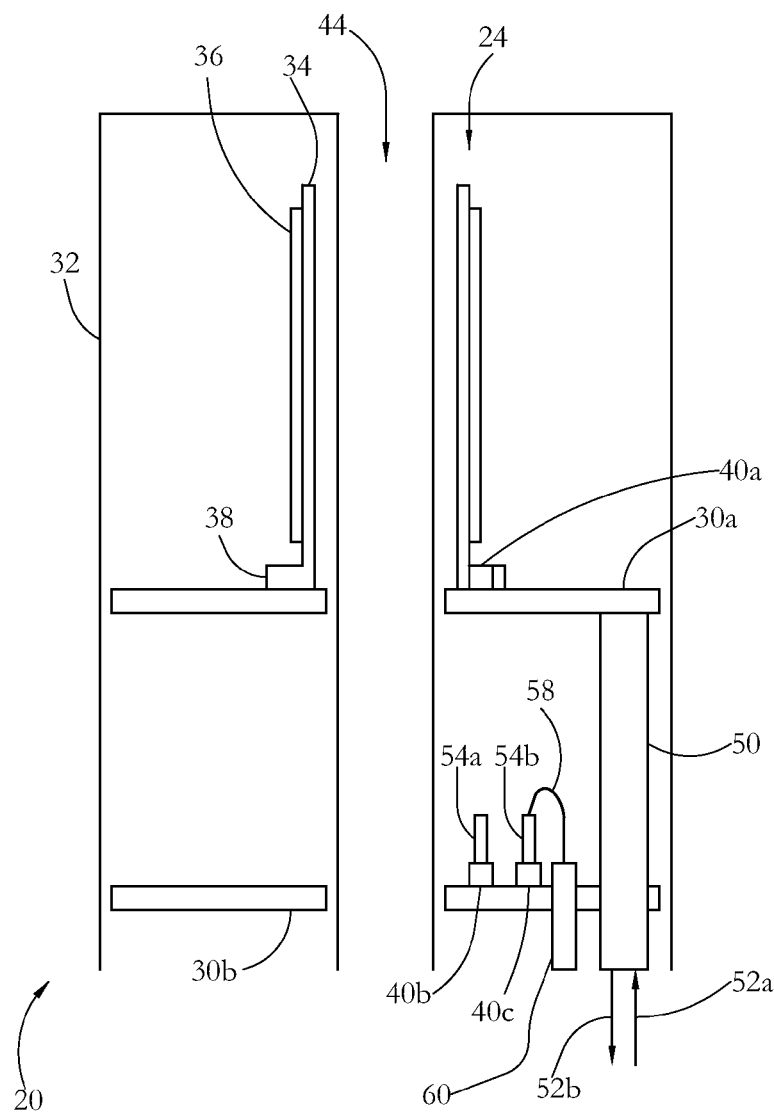
FIG. 2
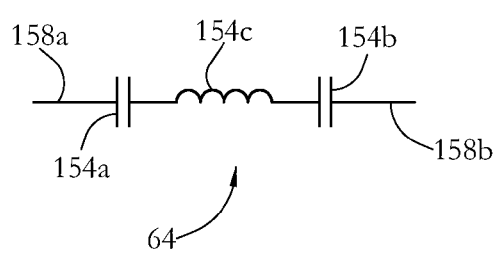
FIG. 3-A
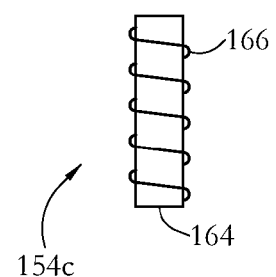
FIG. 3-B

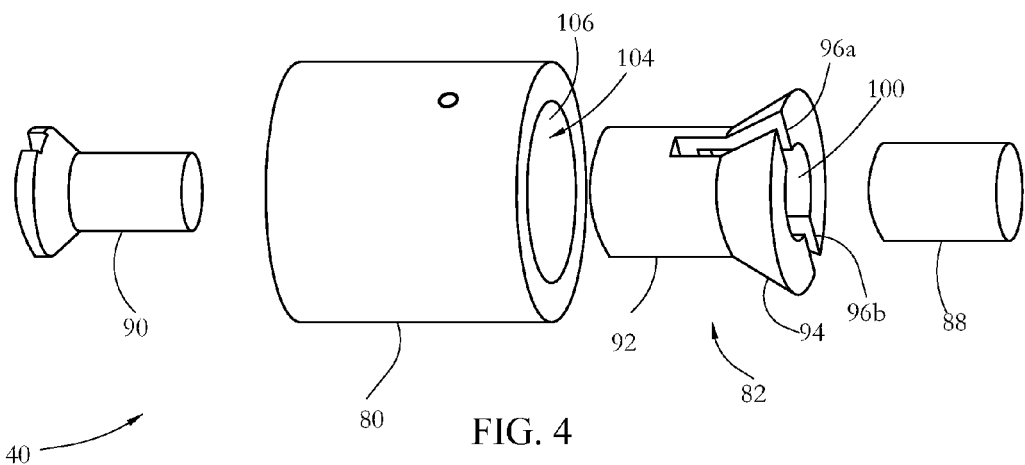
FIG. 4
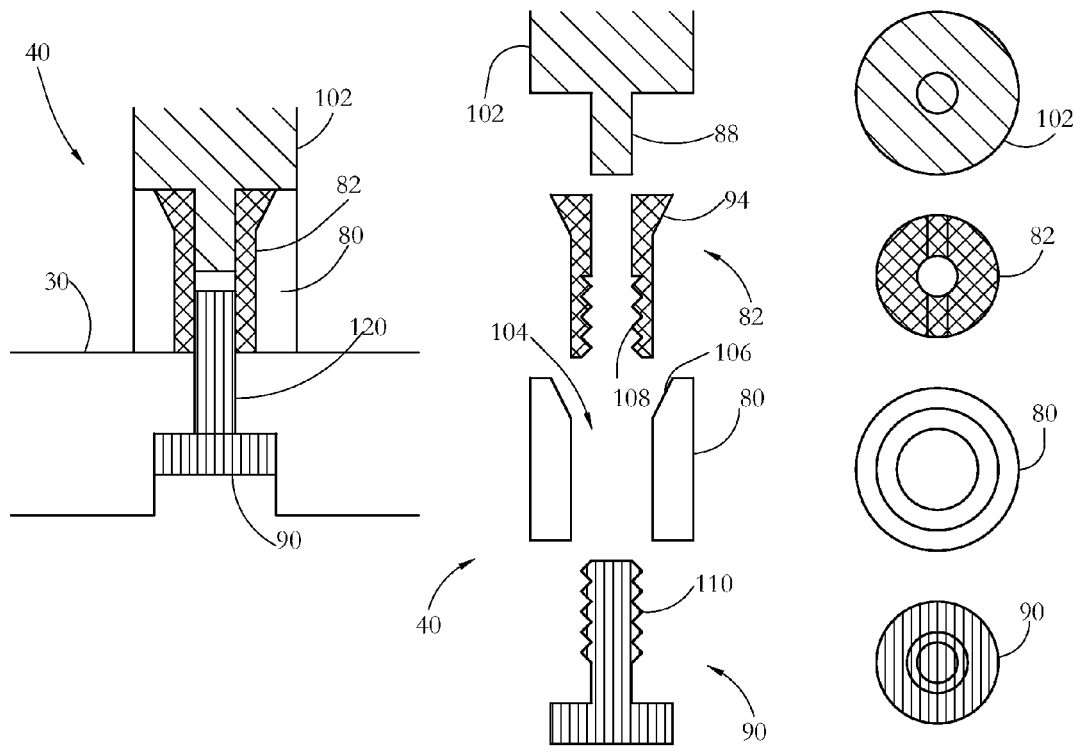
FIG. 5-A  FIG. 5-B  FIG. 5-C

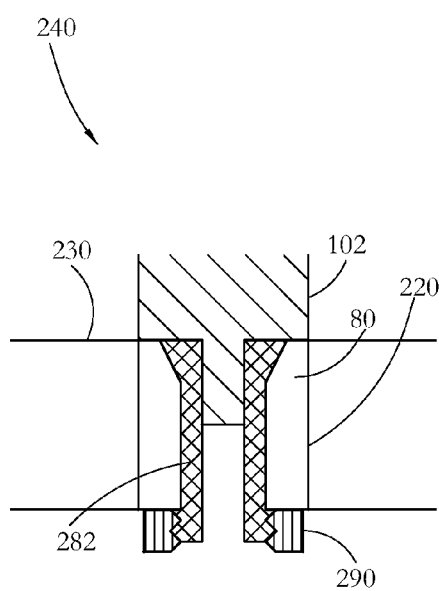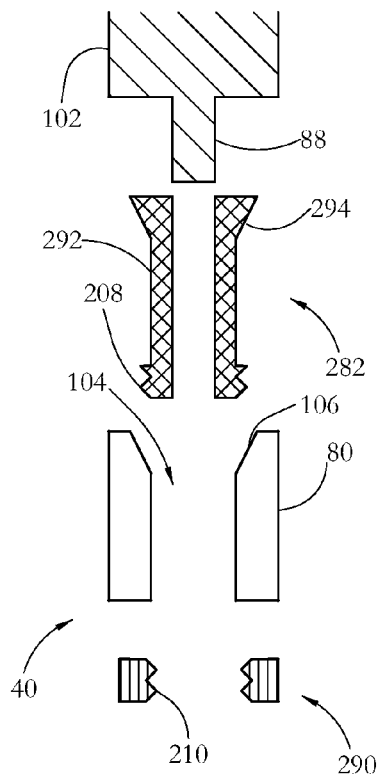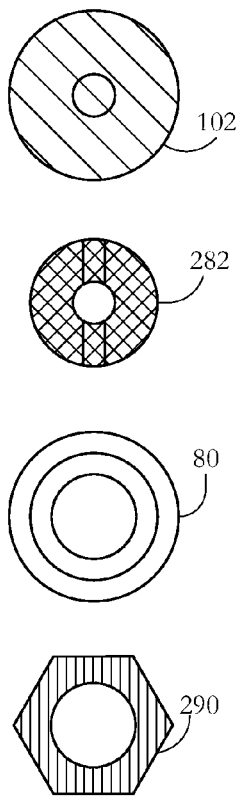
FIG. 6-A    FIG. 6-B    FIG. 6-C

DEMOUNTABLE CRYOGENIC NMR CONNECTION ASSEMBLY SYSTEMS AND METHODS

BACKGROUND OF THE INVENTION

The invention relates to nuclear magnetic resonance (NMR) spectroscopy, and in particular to systems and methods for forming demountable cryogenic NMR connections in NMR spectrometers.

Nuclear magnetic resonance (NMR) spectrometers typically include a superconducting magnet for generating a static magnetic field $B_0$, and an NMR probe including one or more special-purpose radio-frequency (RF) coils for generating a time-varying magnetic field $B_1$ perpendicular to the field $B_0$, and for detecting the response of a sample to the applied magnetic fields. Each RF coil and associated circuitry can resonate at the Larmor frequency of a nucleus of interest present in the sample. The direction of the static magnetic field $B_0$ is commonly denoted as the z-axis or longitudinal direction, while the plane perpendicular to the z-axis is commonly termed the x-y or transverse direction. The RF coils are typically provided as part of an NMR probe, and are used to analyze samples situated in sample tubes or flow cells.

The design of NMR probes is commonly subject to design constraints specific to NMR systems. In particular, the design of NMR probes is commonly subject to tight spatial constraints. Moreover, NMR probes include highly-sensitive RF circuits which are subject to interference from various components of the probes.

Cryogenically cooled probes often allow achieving better sensitivity than conventional room-temperature probes. The increase in sensitivity of cryogenically cooled probes allows effective data acquisition from limited sample sizes and concentrations. At the same time, cryogenic probes introduce new challenges to NMR system designers. For example, system designers may need to establish durable, good-conductivity, NMR-compatible thermal and electrical connections between various NMR probe components at low temperatures.

In a common approach, soldering is used to establish various thermal and/or electrical connections between NMR probe components. For example, NMR measurement circuit components such as capacitors, inductors, or NMR RF coil(s) may be soldered to one or more cryogenically-cooled NMR probe boards (e.g. the probe cold head). Soldering creates a permanent connection, and exposure to heat during the soldering process can adversely affect some system components. At the same time, soldering has remained a common connection method because of the relative difficulty of establishing durable, stable, NMR-compatible connections having good thermal and/or electrical conduction properties between cryogenically-cooled components.

SUMMARY OF THE INVENTION

According to one aspect, a nuclear magnetic resonance (NMR) apparatus comprises a cryogenically-cooled NMR probe support situated within an NMR probe, a NMR probe circuit component of the NMR probe, and a demountable thermal contact assembly for establishing a demountable thermal connection between the NMR probe circuit component and the NMR probe support. The thermal contact assembly comprises a contact assembly body connected to the NMR probe support, a collet positioned within the contact assembly body, the collet having a front slotted collar and a back collet threaded surface, a pin extending through the front collar of the collet and connected to the NMR probe circuit component, and a threaded collet fastener having a fastener threaded surface engaging the collet threaded surface to secure the collet to the contact assembly body and thereby establish the demountable thermal connection between the NMR probe circuit component and the NMR probe support through the pin, collet, and contact assembly body. In some embodiments, the contact assembly body is connected to the NMR probe circuit component and the pin is connected to the NMR probe support.

According to another aspect, a demountable NMR probe component attachment method comprises inserting a pin into a collet, wherein the pin is connected to a first structure selected from a NMR probe circuit component of a NMR probe and a cryogenically-cooled NMR probe support situated within the NMR probe, and wherein the collet includes a collar; inserting the collet into a contact assembly body, wherein the contact assembly body is connected to a second structure selected from the cryogenically-cooled NMR probe support and the NMR probe circuit component; and clamping the collar of the collet onto the pin by connecting a threaded collet fastener to a back thread of the collet, to thermally connect the NMR probe circuit component to the cryogenically-cooled NMR probe support through the pin, collet, and contact assembly body.

According to another aspect, a NMR apparatus comprises a cryogenically-cooled NMR probe support situated within a NMR probe; a NMR probe circuit component of the NMR probe; and a thermally-conductive demountable thermal-contact collet assembly extending through the NMR probe support, and mechanically and thermally connecting the NMR probe circuit component to the NMR probe support.

BRIEF DESCRIPTION OF THE DRAWINGS

The foregoing aspects and advantages of the present invention will become better understood upon reading the following detailed description and upon reference to the drawings where:

FIG. 2 shows a side view of part of an NMR probe according to some embodiments of the present invention;

FIG. 3-A shows a part of an NMR probe circuit including an inductor flanked by two capacitors, according to some embodiments of the present invention;

FIG. 3-B shows the inductor of the circuit of FIG. 3-A according to some embodiments of the present invention;

FIG. 4 shows an isometric view of a thermal contact assembly of the probe of FIG. 2 according to some embodiments of the present invention;

FIG. 5-A shows a side view of the contact assembly of FIG. 4 in an assembled state, according to some embodiments of the present invention;

FIG. 5-B shows an exploded side view of the contact assembly of FIG. 5-A according to some embodiments of the present invention;

FIG. 5-C shows a transverse view of a contact assembly of FIGS. 5-A, 5-B according to some embodiments of the present invention;

FIG. 6-A shows a side view of a contact assembly of the probe of FIG. 2 in an assembled state, according to some embodiments of the present invention;

FIG. 6-B shows an exploded side view of the contact assembly of FIG. 6-A according to some embodiments of the present invention; and FIG. 6-C shows a transverse view of the contact assembly of FIGS. 6-A, 6-B according to some embodiments of the present invention.

DETAILED DESCRIPTION OF PREFERRED EMBODIMENTS

Figure 1:
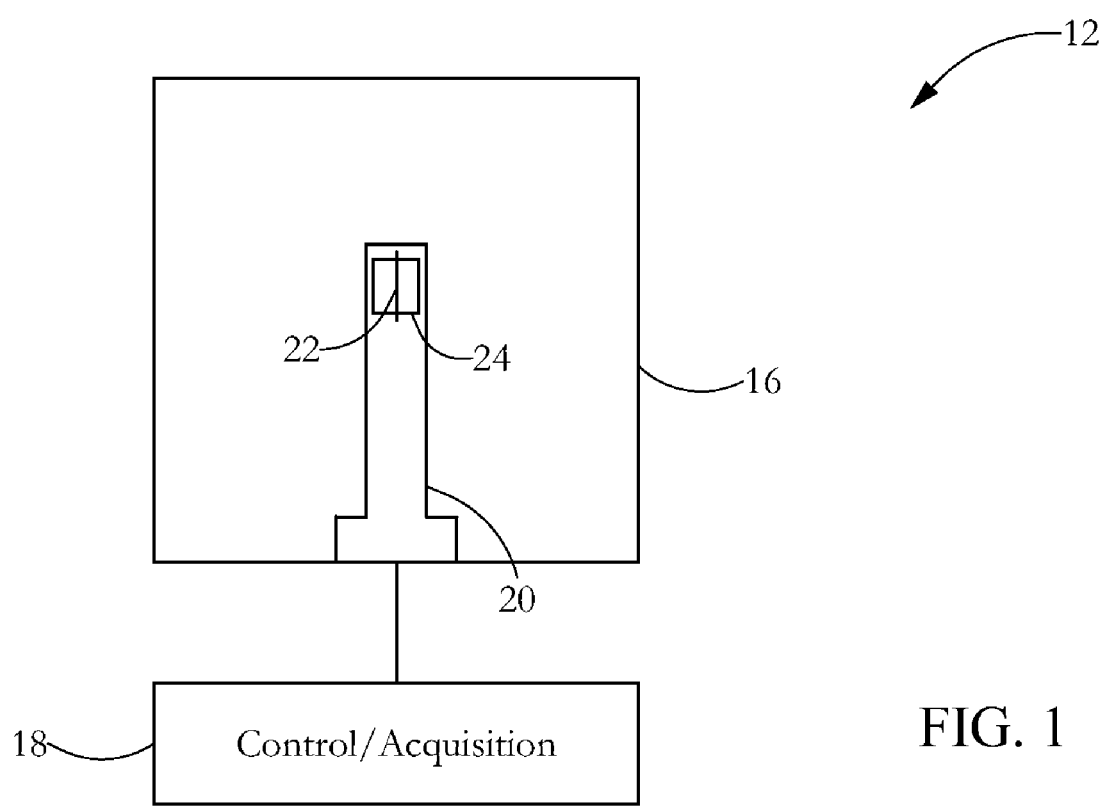
FIG. 1 is a schematic diagram of an exemplary NMR spectrometer according to some embodiments of the present invention.

In the following description, a set of elements includes one or more elements. A plurality of elements includes two or more elements. Any reference to an element is understood to encompass one or more elements. Each recited element or structure can be formed by or be part of a monolithic structure, or be formed from multiple distinct structures. Unless otherwise stated, any recited electrical or mechanical connections can be direct connections or indirect operative connections through intermediary structures. Unless otherwise specified, the term cryogenic refers to temperatures below the liquid nitrogen temperature (77 K).

The following description illustrates embodiments of the invention by way of example and not necessarily by way of limitation.

FIG. 1 is a schematic diagram illustrating an exemplary nuclear magnetic resonance (NMR) spectrometer 12 according to some embodiments of the present invention. Spectrometer 12 comprises a magnet 16, a low-temperature NMR probe 20 inserted in a cylindrical bore of magnet 16, and a control/acquisition system 18 electrically connected to magnet 16 and probe 20. Probe 20 includes one or more radio-frequency (RF) coils 24 and associated electrical circuit components. For simplicity, the following discussion will focus on a single RF coil 24, although it is understood that a system may include other similar coils. RF coil 24 and the various components connected to RF coil 24 form one or more NMR measurement circuits. A sample vessel 22 is positioned within probe 20, for holding an NMR sample of interest within RF coil 24 while measurements are performed on the sample. Sample vessel 22 may be a sample tube or a flow cell.

To perform a measurement, a sample is inserted into a measurement space defined within RF coil 24. Magnet 16 applies a static magnetic field $B_0$ to the sample held within sample container 22. Control/acquisition system 18 comprises electronic components configured to apply desired radio-frequency pulses to probe 20, and to acquire data indicative of the nuclear magnetic resonance properties of the samples within probe 20. RF coil 24 is used to apply radio-frequency magnetic fields $B_1$ to the sample, and/or to measure the response of the sample to the applied magnetic fields. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field. A single coil may be used to perform measurements at multiple frequencies, by tuning the resonant frequency of the NMR measurement circuit that includes the coil. Tuning the circuit resonant frequency may be achieved by adjusting the capacitance values of one or more variable capacitors included in the circuit. Adjusting one or more capacitance values may also be used to achieve impedance matching or other desired circuit characteristics.

FIG. 2 shows a side sectional view of the top part of NMR probe 20 according to some embodiments of the present invention. Probe 20 has a longitudinal measurement aperture 44 for receiving sample vessels of interest. A number of NMR probe components described below are situated within an NMR probe housing 32. RF coil 24 includes an electrically insulative coil support (insert) 34, and a coil conductor 36 mounted on coil support 34. Coil conductor 36 includes a thin conductive foil patterned to define a conductive pattern of a desired shape, e.g. a saddle shape. Coil support 34 includes a cylinder made from a thermally-conductive, electrically-insulative NMR-compatible material such as sapphire. Coil support 34 includes a lip or flange 38 for securing coil 24 to a cold board 30a as described below. In some embodiments, other shapes or configurations for a coil support may be used, for example if the coil conductor is formed by a wire rather than a patterned foil.

A plurality of thermally-conductive cold boards 30a-b are situated within probe 20. Cold boards 30a-b form a plurality of NMR probe supports configured to support NMR probe circuit components such as RF coils, capacitors, inductors. An uppermost board 30a forms part of a probe cold head, which is the part of probe 20 providing structural support and thermal connectivity to RF coil 24. Cold boards 30a-b are in thermal contact with a heat exchanger 50, for cooling cold boards 30a-b. Each cold board 30a-b may be soldered and bolted to heat exchanger 50. Cold boards 30a-b may be formed from an electrically-conductive material, and may be electrically grounded. Heat exchanger 50 may include a volume of a metal foam having a large internal surface area, connected to a cryogenic fluid inlet 52a and a cryogenic fluid outlet 52b. Cryogenic fluid inlet 52a and cryogenic fluid outlets 52b allow the flow of a cryogenic cooling fluid such as helium or liquid nitrogen through heat exchanger 50.

A plurality of NMR circuit components 54a-b are mounted on cold board 30b, underneath cold board 30a. Circuit components 54a-b may include capacitors, inductors, and/or other circuit components electrically connected to RF coil 24 and/or other coils of probe 20. Circuit components 54a-b may be electrically grounded to cold board 30b, and may be connected to an external electrical power (e.g. voltage/current) source through one or more leads 58. Leads 58 pass through a feedthrough 60 extending through cold board 30b. Coil 24 and circuit components 54a-b are mechanically and thermally connected to cold boards 30a-b through demountable thermal contact assemblies 40a-c, respectively. In some embodiments, at least some thermal contact assemblies may also provide electrical conduction paths.

FIG. 3-A shows an NMR probe circuit section 64 including two capacitors 154a-b connected in series with and flanking an inductor 154c, according to some embodiments of the present invention. Capacitors 154a-b are connected externally (e.g. to other circuit components) through leads 158a-b. If cooling is achieved through the electrical connection path(s), one or both of leads 158a-b may also provide thermal conduction path(s) for cooling the components of circuit section 64. In such an embodiment, capacitors 154a-b may be relatively poor thermal conductors, and consequently inductor 154c may be thermally insulated by capacitors 154a-b from any external heat sink. Inductor 154c may then be cooled through an insulative inductor support, as described below.

FIG. 3-B shows inductor 154c according to some embodiments of the present invention. Inductor 154c includes a cylindrical, thermally-conductive and electrically insulative support 164, and an electrically-conductive winding 166 mounted on and thermally connected to support 164. Support 164 may be a rod or tube of a thermally-conductive material such as sapphire. Support 164 is connected to a heat sink such as a cold board through a demountable thermal contact assembly.

FIG. 4 shows an exploded isometric view of a demountable thermal contact assembly 40 in an unassembled state according to some embodiments of the present invention. Thermal contact assembly 40 includes a contact assembly body 80, a collet 82 sized to be inserted into contact assembly body 80, a pin 88 sized to be inserted into a front end of collet 82, and a collet fastener such as a screw 90 sized to be inserted into a back end of collet 82 to secure collet 82 and pin 88 to contact assembly body 80. Collet 82 includes a cylindrical part 92, and a tapered collar 94 connected to and protruding transversely relative to cylindrical part 92. A pair of co-linear slots 96a-b are defined through collar 94 and cylindrical part 92, for allowing a transverse flexure of the two lateral sides of collar 94 as contact assembly body 80 pressed on the tapered surface of collar 94, to securely grip pin 88 within collet 82. A frontal central aperture 100 is defined through collar 94 and cylindrical part 92, and is sized to receive pin 88. Contact assembly body 80 includes a central aperture 104 sized to receive collet 82. A tapered collet-contact surface 106 defined along a front side of central aperture 104 matches the size and taper angle of collar 94.

In some embodiments, contact assembly body 80 is connected to a cryogenically-cooled NMR probe support (e.g. a cold board, heat exchanger, or other thermally-conductive structure mounted on a heat exchanger or cold board), while pin 88 is connected to an NMR probe circuit component (e.g. a sapphire RF coil insert, capacitor, inductor). Contact assembly body 80 may be integrally formed with at least part of the probe support (e.g. may me machined into the cold board or heat exchanger). Contact assembly body 80 may also be a distinct part attached to the probe support by soldering or another thermally-conductive connection. Pin 88 may be integrally formed with at least part of the NMR probe circuit component, or may be a distinct part attached to the NMR probe circuit component through a thermally-conductive connection. In some embodiments, contact assembly body 80 may be connected to an NMR probe circuit component and pin 88 connected to a cryogenically-cooled NMR probe support.

In some embodiments, a metal-to-metal connection or sapphire-to-metal connection between pin 88 and a NMR probe circuit component may be established using an adhesive and/or soldering. An adhesive may include an epoxy such as Shell EPON™ epoxy. A solder connection may be established by first metalizing the sapphire surface using a conductive paste (e.g. DuPont™ 7095 conductive paste), and soldering a conductor to the metalized sapphire. A sapphire-metal solder connection may also be established in some embodiments by direct ultrasonic soldering.

FIG. 5-A shows a side view of thermal contact assembly 40 in assembled state according to some embodiments of the present invention. FIGS. 5-B, 5-C show side and top views of the components of contact assembly 40 in an unassembled state according to some embodiments of the present invention. As shown in FIG. 5-A, contact assembly body 80 is secured to a cold board 30, and is centered above a central aperture 120 extending through cold board 30. Central aperture 120 accommodates screw 90, which is threaded into the back of collet 82 to secure collet 82 to contact assembly body 80. As shown in FIG. 5-B, collet 82 includes an inner thread 108 sized to match an outer thread 110 of screw 90. Pin 88 is inserted into the front of collet 82, and is connected to an NMR probe circuit component 102. A demountable thermal connection is established between NMR probe circuit component 102 and cold board 30 through pin 88, collet 82, and contact assembly body 80. In some embodiments, a demountable electrical connection is established between NMR probe circuit component 102 and cold board 30 through pin 88, collet 82, and contact assembly body 80.

Tightening screw 90 pulls collet 82 longitudinally into contact assembly body 80. The tapered surface of collar 94 is pressed by the matching tapered surface 106 of contact assembly body 80. The transverse pressure on the tapered surface of collar 94 grips pin 88 tightly within collet 82. To demount NMR probe circuit component 102 from cold board 30, screw 90 is loosened and removed from collet 82. Collet 82 is removed from contact assembly body 80 and pin 88 is removed from collet 82.

In some embodiments, the components of contact assembly 40 are made from the same electrically- and thermally-conductive material. The material may be an NMR-compatible material having suitable hardness, electrical conductivity and thermal conductivity properties. In some embodiments, all components of contact assembly 40 are formed of a conductive copper alloy such as tellurium copper or oxygen-free high-conductivity copper (OFHC). Tellurium copper may be used because of its relative hardness and good thermal and electrical conduction properties. The material hardness can facilitate the reliable and repeatable attachment of collet 82 to its corresponding fastener, particularly if a screw such as screw 90 is used. Using one or more materials with substantially identical thermal expansion coefficients for all components of contact assembly 40 allows minimizing temperature-dependent differences in the thermal expansion of the various components, thus facilitating the reliable control of interface forces along the inter-component interfaces of contact assembly 40. If materials with substantially different thermal expansion coefficients are used for different components (e.g. stainless steel for some components and copper for others), a good thermal connection at one temperature (e.g. at room temperature) may exhibit degraded thermal conductivity characteristics at a different temperature (e.g. close to 0 K) as the different assembly components expand at different rates. Cold boards 30a-b may be made from an NMR-compatible, electrically- and thermally-conductive material. In some embodiments, cold boards 30a-b are made from oxygen-free, high-purity, high-conductivity copper.

Contact assembly 40 may be on the order of several mm to several cm in length (longitudinal extent), for example about 0.5-5 cm when assembled. Screw 90 has a length sufficient to pass through its corresponding NMR probe fixed support (e.g. cold board 30 in FIG. 5-A) and mate with the inner thread of collet 82. In some embodiments, screw 90 has a length on the order of several mm to several cm, for example about 0.3-3 cm. For example, screw 90 may be a 0-80 screw having an outer diameter of 1.5 mm. Collet assembly body 80 may have an outer diameter on the order of several mm to cm, for example 0.5-2 cm, an inner diameter smaller than the outer diameter by an extent on the order of mm, for example 1-3 mm, and a length on the order of cm, for example 1-2 cm. Collet 82 may have an inner diameter on the order of mm, for example 2-10 mm, and length substantially equal to that of collet assembly body 80. Pin 88 may have a diameter on the order of mm, for example 2-10 mm, and a length on the order of mm to cm, for example 2-15 mm. The taper angle of collar 94 and tapered surface 106 may have a value between 15 and 60°, for example about 45°.

FIG. 6-A shows a side view of a thermal contact assembly 240 in an assembled state according to some embodiments of the present invention. FIGS. 6-B, 6-C show side and top views of the components of contact assembly 240 in an unassembled state according to some embodiments of the present invention. As shown in FIG. 6-A, contact assembly body 80 is secured to cold board 230, within a central aperture 220 extending through cold board 230. The inner diameter of central aperture 220 matches the outer diameter of contact assembly body 80. A collet 282 is mounted within the central aperture 104 extending through contact assembly body 80. Collet 282 includes a cylindrical part 292, and a tapered collar 294 connected to and protruding transversely relative to cylindrical part 292. Cylindrical part 292 protrudes outside the back surface of cold board 230 when collet 282 is mounted within central aperture 220, exposing an external threaded surface 208. The diameter of threaded surface 208 may be substantially equal to the diameter of cylindrical part 292. For example, threaded surface 208 may have a 4-40 size, which corresponds to a diameter of about 3 mm. A nut 290 having a matching internal threaded surface 210 engages collet 282 to secure collet assembly 240 to cold board 230. Pin 88 is inserted into the front of collet 282, and is connected to an NMR probe circuit component 102. A demountable thermal connection is established between NMR probe circuit component 102 and cold board 30 through pin 88, collet 82, and contact assembly body 80. In some embodiments, a demountable electrical connection is established between NMR probe circuit component 102 and cold board 30 through pin 88, collet 82, and contact assembly body 80.

Tightening nut 290 pulls collet 282 longitudinally with respect to contact assembly body 80. The tapered surface of collar 294 is pressed by the matching tapered surface 106 of contact assembly body 80. The transverse pressure on the tapered surface of collar 294 grips pin 88 tightly within collet 282. To demount NMR probe circuit component 102 from cold board 230, nut 290 is loosened and removed from collet 282. Collet 282 is removed from contact assembly body 80 and pin 88 is removed from collet 282.

Exemplary demountable connection systems and methods as described above allow achieving good thermal conductivity properties in NMR probe connections having limited surface areas and subject to tight spatial constraints, such as connections between a cold board or other NMR probe support and NMR probe circuit components such as RF coil inserts, capacitors and/or inductors. Exemplary collet assemblies as described above allow achieving relatively high contact forces and good thermal conduction properties for inter-component interfaces, while allowing demounting the connections. An external collet fastener such as a nut enclosing the back side of the collet allows using a larger thread size than an internal collet fastener such as screw inserted within the collet. A larger thread size allows achieving improved connection durability while maintaining good connection thermal conduction properties, while minimally affecting the spatial extent of the connection assembly. A number of metals with good thermal conduction properties, such as OFHC, may be relatively soft. The durability of threaded connections made from such metals may be particularly sensitive to thread size.

The common cryogenic attachment approach of soldering various components generally allows achieving compact and reliable connections with good thermal conduction properties, but creates permanent attachments and may require undesirable heating of sensitive NMR probe components during assembly. Other mechanical attachment approaches, such as bolting or using a three-jaw chuck, may not allow achieving sufficiently-good thermal conduction properties for common cryogenic NMR probe applications.

It will be clear to one skilled in the art that the above embodiments may be altered in many ways without departing from the scope of the invention. For example, thermal contact assemblies as described above may be used to mount NMR probe circuit components to heat sinks/supports other than cold boards or heat exchangers, such as for example thermally conductive structures mounted on cold boards, heat exchangers, or other cryogenically cooled NMR probe structures. A collet collar may include multiple slots or other flexure apertures allowing the collet collar to tighten transversely in response to applied longitudinal forces. A collet fastener such as a nut or screw may form part of a larger structure. Collet fasteners other than nuts and screws may be used in some embodiments, particularly if spatial constraints permit the use of such fasteners. A contact assembly body may be machined into a cold board, heat exchanger, or other NMR probe support, or be a separate piece connected to the NMR probe support by soldering or other thermally-conductive attachment. Accordingly, the scope of the invention should be determined by the following claims and their legal equivalents.

What is claimed is:

1. A nuclear magnetic resonance (NMR) apparatus comprising:
   a cryogenically-cooled, thermally-conductive NMR probe support situated within an NMR probe;
   a NMR probe circuit component of the NMR probe; and
   a demountable thermal contact assembly for establishing a demountable thermal connection between the NMR probe circuit component and the NMR probe support, the thermal contact assembly comprising
      a contact assembly body connected to a first structure selected from the NMR probe support and the NMR probe circuit component,
      a collet positioned within the contact assembly body, the collet having a front slotted collar and a back collet threaded surface,
      a pin extending through the front collar of the collet and connected to a second structure selected from the NMR probe support and the NMR probe circuit component, and
      a threaded collet fastener having a fastener threaded surface engaging the collet threaded surface to secure the collet to the contact assembly body and thereby establish the demountable thermal connection between the NMR probe circuit component and the NMR probe support through the pin, collet, and contact assembly body.

2. The apparatus of claim 1, wherein the threaded collet fastener comprises a nut, and wherein the fastener threaded surface is an internal threaded surface.

3. The apparatus of claim 1, wherein:
   the NMR probe support is a NMR probe cold head;
   the NMR probe circuit component is a radio-frequency coil; and
   the radio frequency coil comprises an electrically-insulative, thermally conductive coil support mounted on the cold head, and an electrical conductor mounted on the coil support.

4. The apparatus of claim 1, wherein the NMR probe circuit component comprises a capacitor.

5. The apparatus of claim 1, wherein the NMR probe circuit component comprises an inductor having a conductive part mounted on a thermally-conductive, electrically-insulative inductor support, wherein the conductive part is thermally connected to the NMR probe support through the inductor support and the demountable thermal contact assembly.

6. The apparatus of claim 1, wherein the first structure is the NMR probe support and the second structure is the probe circuit component.

7. The apparatus of claim 1, wherein the first structure is the probe circuit component and the second structure is the NMR probe support.

8. The apparatus of claim 1, wherein the contact assembly body is integrally formed with at least part of the NMR probe support.

9. The apparatus of claim 1, wherein the NMR probe support comprises a cold board, and the apparatus further comprises a heat exchanger in thermal contact with the cold board.

10. The apparatus of claim 1, wherein the NMR probe circuit component is electrically connected to the NMR probe support through the pin, collet, and contact assembly body.

11. A demountable NMR probe component attachment method comprising:
   inserting a pin into a collet, wherein the pin is connected to a first structure selected from a NMR probe circuit component of a NMR probe and a cryogenically-cooled NMR probe support situated within the NMR probe, and wherein the collet includes a collar;
   inserting the collet into a contact assembly body, wherein the contact assembly body is connected to a second structure selected from the cryogenically-cooled NMR probe support and the NMR probe circuit component; and
   clamping the collar of the collet onto the pin by connecting a threaded collet fastener to a back thread of the collet, to thermally connect the NMR probe circuit component to the cryogenically-cooled NMR probe support through the pin, collet, and contact assembly body.

12. The method of claim 11, wherein the threaded collet fastener comprises a nut having an internal threaded surface for engaging the collet.

13. The method of claim 11, wherein the NMR probe circuit component is a radio-frequency coil support, wherein a conductive part of a radio-frequency coil of the NMR probe is mounted on the radio-frequency coil support.

14. The method of claim 11, wherein the NMR probe circuit component comprises a capacitor.

15. The method of claim 11, wherein the NMR probe circuit component comprises an inductor having a conductive part mounted on a thermally-conductive, electrically-insulative inductor support, wherein the conductive part is thermally connected to the NMR probe support through the inductor support and the demountable thermal contact assembly.

16. The method of claim 11, wherein the first structure is the NMR probe support and the second structure is the probe circuit component.

17. The method of claim 11, wherein the first structure is the probe circuit component and the second structure is the NMR probe support.

18. The method of claim 11, wherein the NMR probe support comprises a cold board, and method further comprises establishing a thermal contact between a heat exchanger and the cold board, for cooling the cold board.

19. The method of claim 11, further comprising establishing an electrical connection between the NMR probe circuit component and the NMR probe support through the pin, collet, and contact assembly body.

20. A NMR apparatus comprising:
   a cryogenically-cooled NMR probe support situated within a NMR probe;
   a NMR probe circuit component of the NMR probe; and
   a thermally-conductive demountable thermal-contact collet assembly extending through the NMR probe support, and mechanically and thermally connecting the NMR probe circuit component to the NMR probe support.

* * * * *